United States Patent [19]
Butler et al.

[11] 3,955,125
[45] May 4, 1976

[54] FAIL-SAFE ACTIVE TIMING CIRCUIT

[75] Inventors: William K. Butler; Robert F. Anderson, both of Rochester, N.Y.

[73] Assignee: General Signal Corporation, Rochester, N.Y.

[22] Filed: Feb. 21, 1975

[21] Appl. No.: 551,817

[52] U.S. Cl............................. 317/141 S; 307/293
[51] Int. Cl.² ....................................... H03K 17/26
[58] Field of Search ................ 317/141 S; 307/293; 331/113 R

[56] References Cited
UNITED STATES PATENTS

| | | | |
|---|---|---|---|
| 3,473,054 | 10/1969 | Wieczdrek................ | 317/141 S UX |
| 3,693,031 | 9/1972 | Eaton................................. | 307/293 |
| 3,774,082 | 11/1973 | Chang.............................. | 317/141 S |
| 3,814,991 | 6/1974 | Hewitt............................. | 317/141 S |

*Primary Examiner*—R. N. Envall, Jr.
*Attorney, Agent, or Firm*—Milton E. Kleinman; John Ohlandt

[57] ABSTRACT

A fail-safe timing circuit which includes a variable passive timing element and an active timer or timing device so as to control a device, for example, a fail-safe or B-relay such as is used in railroad signaling.

8 Claims, 3 Drawing Figures

FAIL-SAFE ACTIVE TIMING CIRCUIT

BACKGROUND OBJECTS AND SUMMARY OF THE INVENTION

The present invention relates to a timing arrangement or circuit and more particularly, to one that can ensure fail-safe operation when it is used in conjunction with a control device such as a relay for actuating or controlling emergency devices, such as brakes on a railroad car.

It has been known to provide so-called "block boundaries" in operating conventional railroad equipment and to arrange for delayed application of emergency devices such as brakes in the event that a train passes a boundary or a block boundary at a predetermined speed. However, such delays are usually very short, being of the order of six or seven seconds. In such cases, a timing circuit involving the use of a capacitor is connected to what is known as a B-relay. Such a relay is well-known in the railroad signaling or communicating arts, being a relay which has nonweldable contacts, will not respond to reverse polarity, and has other characteristics such that it will fail-safe; that is to say, it will produce a safe condition such as applying the brakes to a train in the event that any part of the system fails.

A significant problem, however, presents itself under specifications that call for delaying the safety brake application for more extended time periods; that is, for time periods which vary widely and are as extended as fifty or more seconds. In these cases, the size of capacitors necessary to hold a control device such as the aforenoted B-relay for an extended time of the order of fifty seconds would have to be extremely large such as twenty thousand microfarads. It turns out that the only capacitors of this size that would be useful are electrolytic capacitors; however, electrolytic capacitors would not meet specifications that have recently been imposed whereby tolerances are not to exceed ± 10 per cent over a temperature range of −30° F. to +160° F.

Accordingly, it is a primary object of the present invention to provide a fail-safe timing circuit that will satisfy the aforenoted specifications with regard to furnishing the requisite extended time period or delay in the application of emergency devices and also to meet the stringent temperature coefficients and tolerances imposed.

Another major object is to meet reduced tolerance specifications even in those cases where the time delay is not an abnormally long one, that is to say, even in those cases normally encountered under conventional specifications; where standard time delays of approximately six seconds are called for, but the tolerances on the exactitude of timing have been severely lowered such that previously satisfactory prior art arrangements will not fulfil the purpose.

In fulfilment of the above stated objects, it is a broad feature of the present invention that a fail-safe timing circuit is provided which enables the use of a capacitor of small capacitance value for extended time delay applications while satisfying stringent temperature coefficient and tolerance requirements; or in the alternative, permits using a capacitor, normally employed for conventional, short-time delay purposes, in such a way that much more stringent tolerance requirements than normally imposed can be met. In the former case, that is, where a capacitor of small value can be substituted for an extremely large one, the saving in physical size is considerable inasmuch as integrated circuits, which are used with the small capacitor, are made in such small sizes today that they consume very little space in the complete package. In other words, a bonus advantage accrues in physical size reduction, in addition to satisfying temperature coefficient and tolerance requirements.

The fail-safe timing circuit or system of the present invention comprises a variable passive timing element in the form of a capacitor which operates to establish a predetermined delay, coupled with a means for translating that predetermined delay into the extended delay period required before the emergency devices are to be activated.

The preferable means for providing the requisite translation between the predetermined delay furnished by the capacitor and the extended period desired takes the form of an active timing device comprising a plurality of transistors in a circuit, and preferably including a unit known as a 555 timer which operates so as to repeat its timing cycle responsive to, and to the extent of, the charge present on the passive element.

Another basic feature of the present invention includes the provision of a tuned circuit just prior to the utilization device in the form of the aforesaid B-relay. In accordance with this tuned circuit arrangement, only an output signal of a particular frequency will be passed and will be capable of maintaining the relay energized. Any other signal or lack of signal will produce no output current to such relay and hence the relay will become de-energized. Thus, a fail-safe operation for the relay is insured in the event that the prescribed frequency, within ±10 per cent, is not being received at the output of the timing circuit of the present invention.

Other and further objects, advantages and features of the present invention will be understood by reference to the following specification in conjunction with the annexed drawings, wherein like parts have been given like numbers.

DESCRIPTION OF PREFERRED EMBODIMENT

Figure 1A:
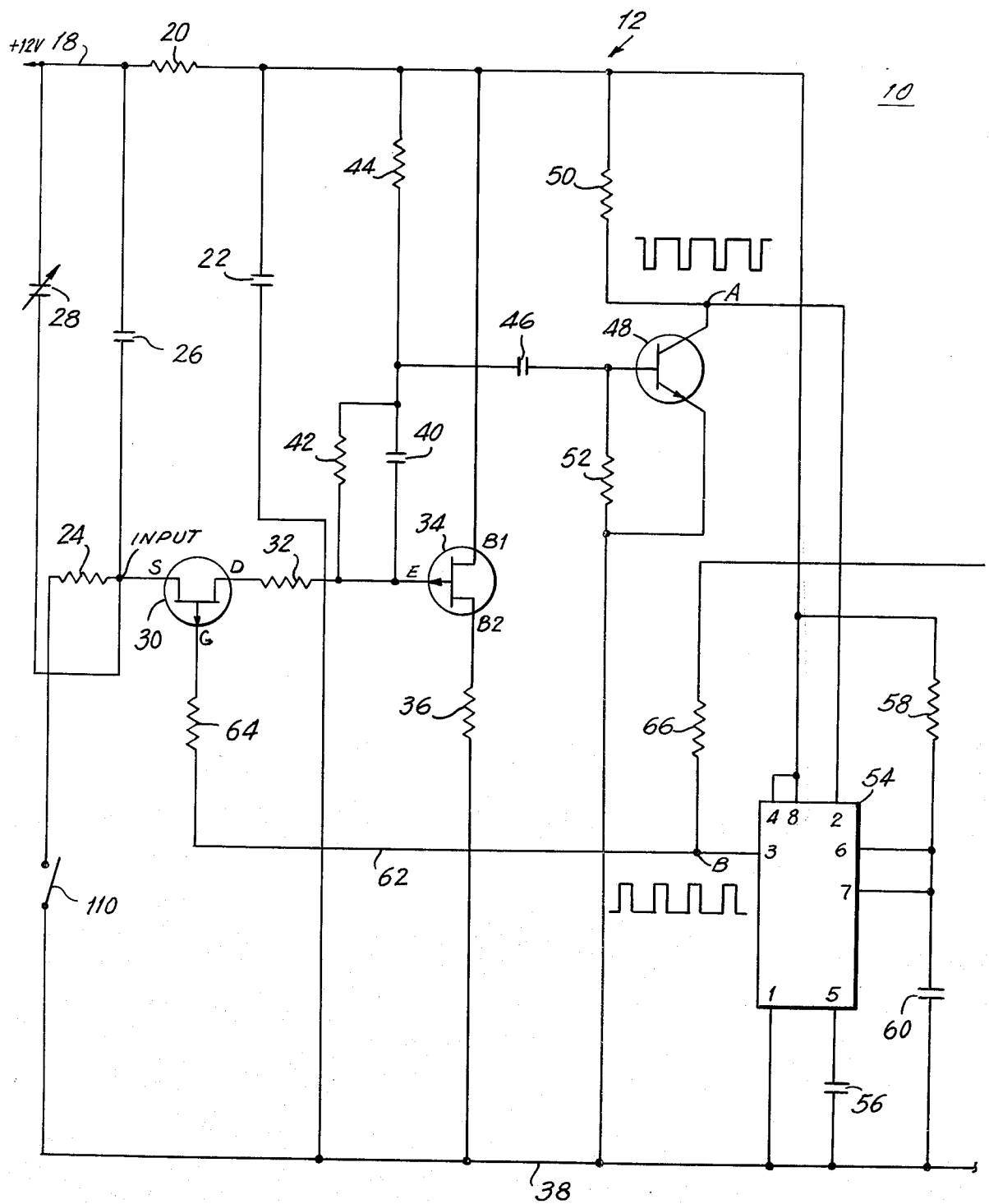
FIGS. 1A and 1B are schematic diagrams of a portion of the timing circuit in accordance with a preferred embodiment of the present invention.
Figure 1B:
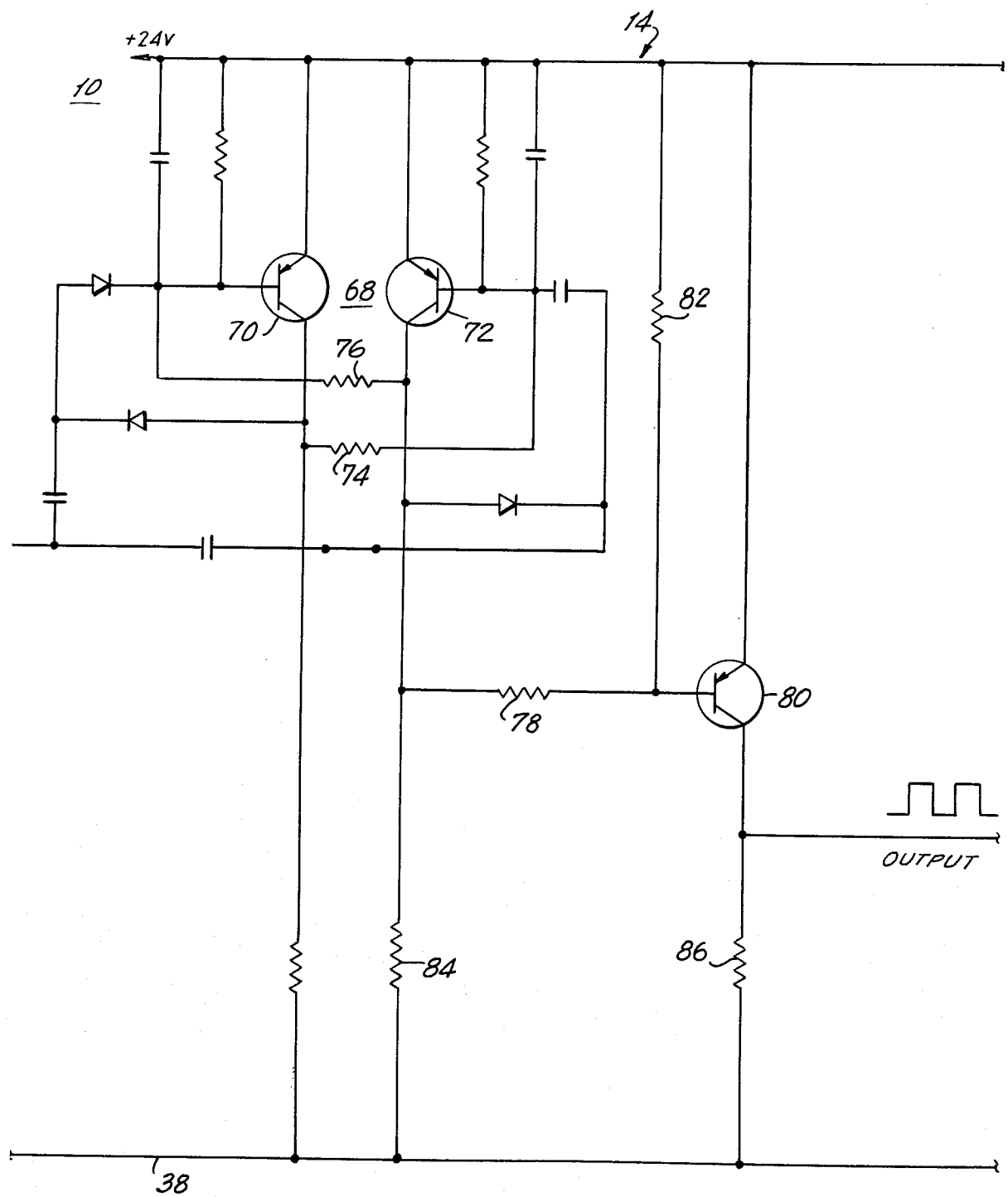
Figure 2:
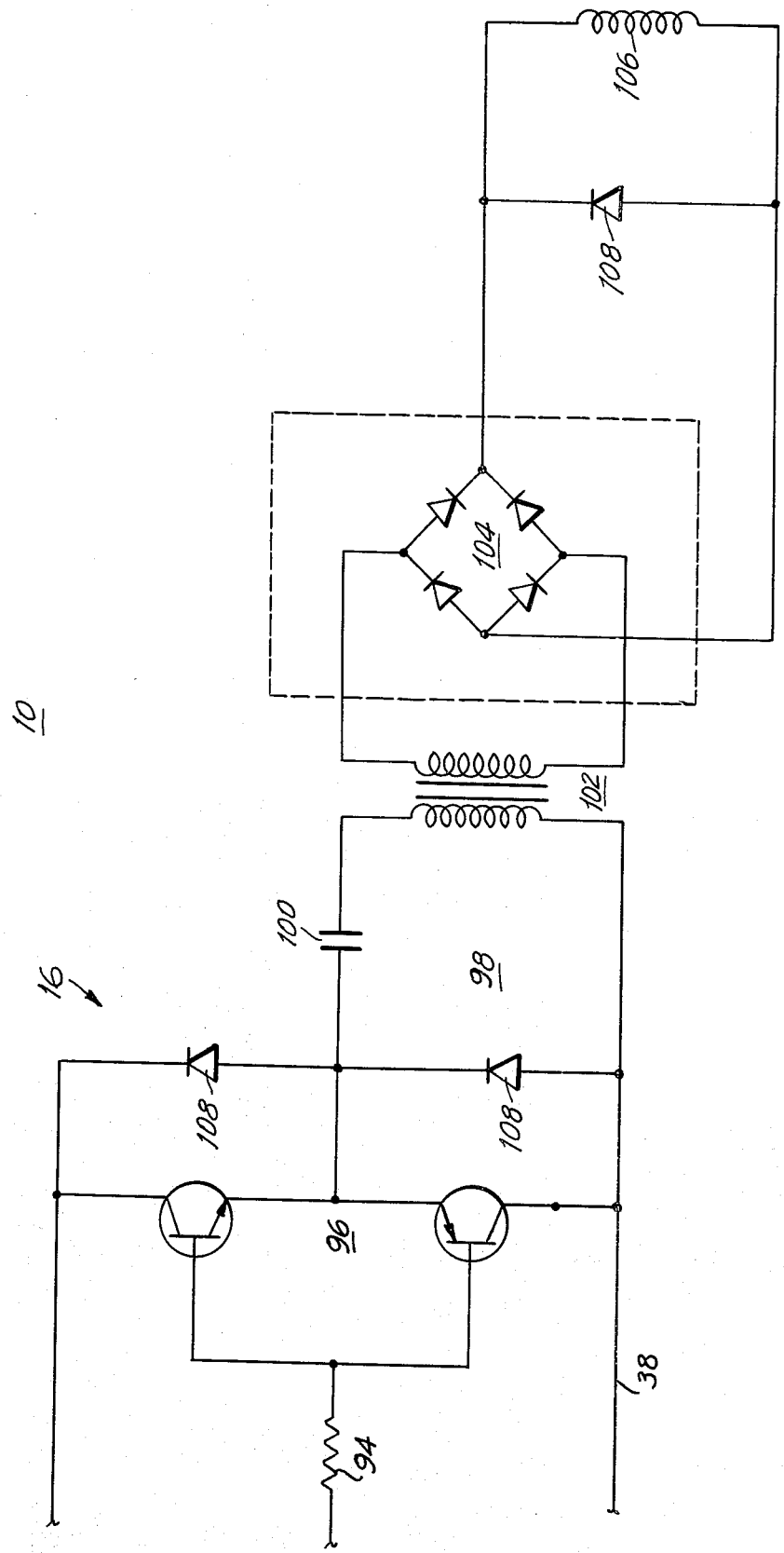
FIG. 2 is a schematic diagram of the remainder of the aforesaid timing circuit, particularly illustrating the output stages thereof including the utilization device whose operation is to be controlled.

Referring now to FIGS. 1A, 1B and 2, there is shown in the combination of these figures the complete fail-safe timing circuit of the present invention, that is to say, a circuit which provides a very accurately controlled time delay between the occurrence of an alarm or emergency condition and the eventual application of safety equipment in response to the occurrence of such alarm condition.

In the particular example under consideration in accordance with a preferred embodiment, the timing circuit is adapted to provide for a delay in the application of safety brakes depending on varying predetermined alarm conditions. Thus, it is contemplated that when trains enter a block boundary, instead of the immediate imposition or application of the safety brakes, as would occur normally, a predetermined time delay is allowed in order to improve the headway for such trains.

The entire circuit or system is designated 10 and comprises the initial section 12 which provides the function of the critical timing and translation from a predetermined charge storage in a capacitor, which has a very small time constant such that it would normally discharge completely in a comparatively short time, to an extended period for discharging said capacitor and effectively extending the delay time afforded by such charged capacitor.

This initial section 12 has its own power supply, separated from the power supply to a middle section 14 whose function is to modify the pulse output from a timer and to provide amplification of the pulse wave emanating therefrom. Thus it will be seen that a 12 volt Zener supply is connected to the initial section 12. The middle section on the other hand is supplied with +24 volts, as is the output section 16 seen in FIG. 2. The different power supply voltages are provided so as to maintain strict separation between the critical timing portion and the rest of the circuit. The 12 volt supply is connected by way of line 18 to a decoupling network comprising resistor 20 and capacitor 22. Such decoupling is standard practice and is important in suppressing noise so that no spurious signals can interfere with proper operation of the circuit.

Connected to the input terminal so designated is a resistor 24 and a main or principal capacitor 26 used for storing charge that will determine the delay time interval, subject to the translation to be explained. Connected in parallel with capacitor 26 is an additional bank of capacitors 28 symbolized by a variable capacitor symbol. This bank of capacitors enables varying the delay time as called for.

In a typical application for the circuit a delay time of 36 seconds might be selected, in which case a capacitor value of approximately 18 microfarads would be selected, figured on the basis of approximately two seconds time delay for each microfarad of capacitance introduced at the input.

It will be seen that a field effect transistor 30 is connected at the input of the circuit, such field effect transistor being, per se, well-known and being provided with what are termed source, drain and gate electrodes, the source electrode being connected as the input, the drain electrode being connected as the output, and the gate electrode, symbolized by the arrow, being the common terminal. Such a field effect transistor or FET has a notably high ratio of ON to OFF resistance. Thus, it typically has an ON resistance of 30 ohms, whereas its OFF resistance is 5 or 6 megohms.

The output of the FET 30 is connected by way of a resistor 32 to the emitter (symbolized by the arrow) of what is known as a complementary unijunction device 34. The upper base of the unijunction device 34 is connected to the 12 volt power supply through the decoupling resistor 20. The second or lower base is connected through a resistor 36 to ground bus bar 38.

It will be noted that the parallel combination of a capacitor 40 and a "bleed" resistor 42 are connected at the input of the unijunction device 34. In series with this combination is another resistor 44 connected to the 12 volt power supply. A capacitor 46 is connected between the junction of the two resistors 42 and 44, and the base of a transistor 48. The collector of transistor 48 is connected through a suitable resistor 50 to the power supply, the emitter thereof being connected to the ground bus bar 38, and likewise, the base of transistor 48 is connected, but through a resistor 52, to the same ground bus bar.

It should be noted that the already described complementary unijunction device 34 is a very stable device so that it is considered as a no-fail device. Such device has a stand-off ratio of 0.58 to 0.62. It should also be noted that the resistor 44 allows for the proper output for driving the transistor 48; that is to say, it enables applying a positive going pulse rather than a negative going pulse to the base of transistor 48. The function of transistor 48 is simply to provide sufficient amplification for the pulse input thereto. The bipolar transistor 48 is shown as a NPN type; however, the opposite type polarity can just as easily be used with suitable modification. It will also be noted that transistor 48 is in a common emitter or inverter mode or configuration.

The output from transistor 48 is connected to the input of a timing device or timer designated 54. This timer is a commonly used integrated circuit component and its full or complete configuration can be appreciated by reference to a current catalog of the Motorola Corporation, Phoenix, Arizona, under their specification for MC1555. The terminal designations used by the manufacturer are indicated in FIG. 1A. This integrated circuit unit is designed to function as a one-shot multi-vibrator in the particular arrangement depicted.

Terminal 1 of the timer 54 is connected to ground bus bar 38. Terminal 2, which is the input or trigger terminal, is connected to the output (collector) of transistor 48, while terminal 3 serves as the output terminal. Terminal 4, called the reset terminal, is not used in this instance and is therefore strapped to power supply terminal 8 which is connected to the +12 volt power supply. Terminal 5, which is a "control voltage" terminal, is connected by way of capacitor 56 to ground. Terminals 6 and 7 are connected together, and the elements necessary to set the particular time delay that has been chosen, that is, a resistor 58 and a capacitor 60, are connected from the joined together terminals 6 and 7 and respectively connected to terminal 8 and to ground. In the particular example under consideration, the time delay for the timer 54 is selected to be one millisecond.

It will be noted that output terminal 3 of the timer 54 is connected by a feedback line 62 to a resistor 64 and thence to the gate of field effect transistor 30. Resistor 64 is a film resistor which will fail only by increasing its resistance value, thus being safe. Also connected to terminal 3 is a resistor 66 which is in turn connected to the flip-flop unit 68, connection being made to the individual halves of the flip-flop by respective coupling capacitors and diodes in a well-known manner.

Each half of the flip-flop 68 is made up or consists of an NPN transistor, such a transistor designated 70 being seen on the left and another NPN transistor 72 on the right. These are both suitably connected to the other power supply, that is, to +24 volts, through biasing resistors and decoupling capacitors.

It should also be noted that the usual cross-coupling arrangement is provided between the respective collectors and bases of the opposite halves or sides of the flip-flop. Accordingly, a resistor 74 is connected from the collector of transistor 70 to the base of transistor 72, and correspondingly, a resistor 76 of identical value is connected from the collector of transistor 72 to the base of transistor 70. It is so arranged that one side of the flip-flop will be ON while the other is OFF. Assuming that transistor 70 is ON, then the potential at its collector rises to a point sufficient to bias transistor 72 to the OFF state so that the two transistors will remain in their respective states until a pulse or signal is received at the input.

It will be appreciated that flip-flop 68 is an extremely unsensitive device, that is to say, noise won't effect its operation. Also, it will operate such as to provide a 50 per cent duty cycle which is required at later stages of the circuit.

The output from flip-flop 68 is taken from the collector of transistor 72 and by way of a resistor 78 to the base of an NPN transistor 80. This base of transistor 80 is also connected through a resistor 82 to the power supply while the emitter transistor 80 is directly connected thereto. Another resistor 84 is connected from ground to resistor 78. Accordingly, transistor 80 is biased in the active region to act as an amplifier of the output pulses from the flip-flop 68. The output is taken from transistor 80 at the collector which is connected through a resistor 86 to ground.

Referring now to FIG. 2, it will be understood that an output signal from transistor 80 is applied through resistor 94 to the base inputs of the dual emitter follower stage 96. The output of the emitter follower stage is connected to the tuned circuit 98 which acts to discriminate against all frequencies except a frequency of 500 Hz., within ±10 per cent.

The tuned circuit 98 includes a capacitor 100 and transformer 102, the output of the latter being connected to a full wave bridge rectifier 104. The output of the bridge rectifier 104 is connected to the vital or B-relay 106. As noted before, the operation of such a relay is such that when de-energized it acts to apply emergency equipment such as safety brakes, thus providing fail-safe operation. In other words, when energized it keeps the safety brakes unapplied but if for any reason there is failure of current to the relay, the safety brakes are immediately applied.

The several diodes 108 used at different points in the final stages of the circuit are simply used to suppress spurious signals that would interfere with its proper operation.

OPERATION

The operation of the fail-safe timing circuit of the present invention is as follows: Under normal circumstances, and under the assumption that the timing circuit is to be applied in a fail-safe system for the application of safety brakes or the like when a railroad train moves into a block boundary, then a switch 110 seen at the lower left of FIG. 1A is closed so as to connect the ground bus bar to the input terminal such that capacitor 26 will become charged through resistor 24. Since transistor 30 is normally ON, a substantial potential is applied to its input as a result of the charging of capacitor 26 such that capacitor 40 in turn becomes charged up and its potential changed to a point such that transistor 34 is triggered, thereby eventually producing a pulse at the collector of transistor 48. Such a pulse can be appreciated by referring to the wave form depicted on FIG. 1A at the point designated A (collector of transistor 48).

The negative going pulse produced at this time, that is to say, when transistor 34 has been triggered, starts the timer 54 to run its cycle, such cycle being controlled by the selection of capacitor 60 and resistor 58 as noted hereinbefore. As one example, in a practical operation for this circuit, a time period of one millisecond has been selected. Thus, as will be seen by referring to the output at terminal 3 of timer 54, a pulse wave form at point B will be obtained. The short duration pulses represent or correspond with the time that the timer 54 is de-activated. In other words, when activated the timer sets low; hence the pulse wave form has a low value of voltage for the timing period of 1 millisecond, whereas the high value or short duration pulse exists for approximately 16 microseconds. The latter time period also corresponds with the period that the field effect transistor 30 is ON during a full or complete cycle of operation, such transistor 30 being OFF during the timing period of the timer 54.

It will be appreciated that transistor 30 is turned OFF during the timing period of timer 54 precisely because the feedback connection 62 acts to disable such transistor 30. However, when the period of the 1 millisecond ends, transistor 30 is turned ON again to begin the cycle all over.

It will also be understood that the output pulse at terminal 3 of timer 54 operates to toggle or change the state of flip-flop 68. As long as the input is connected to ground bus bar 38 by reason of the closure of switch 110, the cycle persists and the output pulses from the timer 54, operating upon flip-flop 68, result in producing a square wave at the output of the amplifying transistor 80. This will be seen at point C corresponding to such output.

It will be noted that the wave form C differs substantially from wave form B because of the effects produced by the operation of flip-flop 68, involving a well-known stable state operation and with the frequency halving effect resulting therefrom.

The pulse wave from C produced at the output of transistor 80 is transmitted through the tuned circuit and then through transformer 102 to rectifier 104 at the output of which a sufficient voltage is available for maintaining the vital or B-relay 106 in the energized state thus preventing application of safety brakes or the like.

It will therefore be understood that the tuned circuit 98 functions as a final check on whether or not the prescribed frequency of 500 Hz. is being received. If for any reason such a frequency, within ±10 per cent, is not received, then the aforedescribed function will not obtain and safety brakes will be applied. Thus under normal circumstances, assuming that the proper frequency of 500 Hz. is being received, all is well and there will be no necessity to apply the safety brakes.

Assume, however, that an emergency condition arises. In our particular example, let it be assumed that a train enters a block boundary which calls for the application of safety brakes in the event that a predetermined speed is being exceeded. In this event, the switch 110 will move to the open condition and, when this happens, bus bar 38 is no longer connected to the input of the circuit and accordingly, a significantly different set of circumstances now exists which calls for a different result. However, rather than produce immediate application of safety brakes, the timing circuit of the present invention permits an appropriate time delay before such application. This of course is because the charge already existing on capacitor 26 will keep the previously described full cycle going for a predetermined time period. During each time that transistor 30 is turned on, a small charge is removed from capacitor 26 thereby to charge capacitor 40. After the appropriate number of cycles has been gone through, a sufficient charge will have been removed from capacitor 26 to prevent further firing of transistor 34. As a consequence, the square wave of requisite repetition rate at the output will cease and, as a result, the B-relay 106 will no longer be energized and hence will function to apply safety brakes.

It will have become apparent that, because the duty cycle of transistor 30 (ratio of ON time to OFF time) can be made very small and consequently the only time capacitor 26 is discharging is during the ON time of transistor 30, only a very small change in charge is involved with each cycle of the timing operation. Hence this feature makes possible very long timing periods or time delays using relatively small values of capacitance. More broadly stated, the timing circuit of the present invention provides a significant feature that permits, with extremely good accuracy, enhancement or amplification of the time period inherently available from a passive device. Accordingly, a relatively small capacitance device, which would normally permit achieving a time delay of only a predetermined short period, can act to provide a much longer time period with an accuracy greatly increased over that obtainable by employing the larger capacitance device which is inherently capable of providing such longer time period.

In order to enable one skilled in the art to conduct a circuit as described, the following values and designations of components are provided:

(All resistor values are ½ watt ± 5 percent unless otherwise indicated. All diodes are IN4148 unless otherwise indicated.)

RESISTORS:
```
20-82 ohms                    64-.475 Mohms (1/4w, 1%)
24-47 ohms                    74-16 Kohms
32-43 Kohms                   76-16 Kohms
36-1.2 Kohms                  78-33 Kohms
42-.47 Mohms                  82-33 Kohms
44-47 ohms                    84-5.1 Kohms
50-4.7 Kohms                  86-4.7 Kohms
52-39 Kohms                   92-2.7 Kohms
58-97.6 (1/4w, 1%) Kohms      94-2.7 Kohms
```

CAPACITORS:
```
22-15 Mfd/20v                 46-.001 Mfd
26-3 Mfd                      56-.01 Mfd
40-470 Pfd                    60-.01 Mfd
     100-.15 Mfd
```

TRANSISTORS:
```
30-2N5019                     70-2N3906
34-2N6114                     72-2N3906
48-2N3904                     80-2N3906
     96-2N4403
```

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

What is claimed is:

1. A fail-safe timing circuit for providing a variably selectable delay period before a control device operates, comprising:

a passive timing element having an inherent discharge period for establishing a delay for a control signal;

a control device whose operation is to be affected by said control signal;

an active timing device operative in response to charge present on said passive element so as to perform repetitively its predetermined timing cycle;

a translating device connected between said passive element and said active timing device so as to translate or extend the inherent discharge period of the passive element, said translating device having a small ratio of ON time to OFF time such that a very small change in charge on the passive element is effected for each cycle of the timing device.

2. A timing circuit as defined in claim 1, in which said passive element is operative to discharge during the ON time of the translating device, which ON time corresponds substantially with deactivation of said timing device.

3. A timing circuit as defined in claim 1, in which feedback means are provided between the active timing device and said translating device and operative such that said translating device is turned OFF during the period when said timing device is activated.

4. A circuit as defined in claim 1, in which the output of said timing device is connected to said feedback means and is further connected to the input of a flip-flop device, said flip-flop device providing at its output a pulse wave form having a fifty per cent duty cycle and having a repetition rate that corresponds with a selected frequency to be passed.

5. A circuit as defined in claim 4, further comprising a tuned circuit, including a transformer, for detecting the output from said flip-flop device and for discriminating against other than the selected frequency.

6. A circuit as defined in claim 5, further including a bridge rectifier connected to the secondary side of said transformer, and a vital relay connected to the DC side of said bridge rectifier, said vital relay receiving an energizing voltage of a frequency passed by said tuned circuit.

7. A fail-safe timing circuit for providing a predetermined delay period for the actuation of a control device, comprising:

a passive timing element in the form of a capacitor, said capacitor having an inherent discharge time which determines said delay period;

means for translating or extending the discharge time of said capacitor, said means including an active timing device operative to remove repetitively small increments of charge from said capacitor and to provide extended time intervals therebetween during which no charge is removed, said means for translating further including means for providing a predetermined pulse wave form to a utilization device.

8. A circuit as defined in claim 7, further comprising means at the input of said passive timing element for producing continuous charging of said passive timing element from a voltage source and, in response to an alarm condition, disconnecting the voltage source from said passive timing element so that the charge remaining on said passive timing element is removed in the aforesaid small increments until exhausted, whereby the total delay period is established.

* * * * *